(12) United States Patent
Solihin

(10) Patent No.: US 9,292,629 B2
(45) Date of Patent: Mar. 22, 2016

(54) BUILDING PATH IDENTIFICATION

(75) Inventor: Wawan Solihin, Singapore (SG)

(73) Assignee: Autodesk, Inc., San Rafael, CA (US)

( * ) Notice: Subject to any disclaimer, the term of this patent is extended or adjusted under 35 U.S.C. 154(b) by 567 days.

(21) Appl. No.: 13/560,442

(22) Filed: Jul. 27, 2012

(65) Prior Publication Data

US 2014/0032179 A1 Jan. 30, 2014

(51) Int. Cl.
*G06F 17/50* (2006.01)

(52) U.S. Cl.
CPC .......... *G06F 17/5004* (2013.01); *G06F 17/509* (2013.01)

(58) Field of Classification Search
CPC ...................................... G06F 17/50
USPC .............................................. 703/1
See application file for complete search history.

(56) References Cited

U.S. PATENT DOCUMENTS

| | | | | |
|---|---|---|---|---|
| 4,653,974 | A * | 3/1987 | Anderson | 414/343 |
| 6,709,200 | B1 * | 3/2004 | Reynolds | 405/239 |
| 8,280,574 | B2 * | 10/2012 | Yabushita et al. | 701/25 |
| 2002/0072956 | A1 * | 6/2002 | Willems | G06Q 10/04 705/7.31 |
| 2007/0027732 | A1 * | 2/2007 | Hudgens | 705/7 |
| 2008/0062167 | A1 * | 3/2008 | Boggs et al. | 345/419 |
| 2008/0103941 | A1 * | 5/2008 | Hussain | 705/28 |
| 2008/0273791 | A1 * | 11/2008 | Lee et al. | 382/153 |
| 2010/0274430 | A1 * | 10/2010 | Dolgov | G01C 21/20 701/25 |
| 2011/0216954 | A1 * | 9/2011 | Sundar et al. | 382/131 |
| 2011/0270584 | A1 * | 11/2011 | Plocher | G06F 17/5004 703/1 |
| 2013/0303193 | A1 * | 11/2013 | Dharwada et al. | 455/456.3 |

OTHER PUBLICATIONS

Bhattacharya et al. ("Roadmap-Based Path Planning—Using the Voronoi Diagram for a Clearance-Based Shortest Path", IEEE, 2008, pp. 58-66).*
Honiden et al. ("Approximate Shortest Path Queries Using Voronoi Duals", 6th annual International Symposium on Voronoi Diagrams in Science and Engineering, 2009, pp. 1-25).*
Dr John Keung ("building planning and massing", Building and Construction Authority, Singapore, 2010, pp. 6-110).*
Christmann et al. ("Modeling Urban Environments for Communication-Aware UAV Swarm Path Planning", Georgia Institute of Technology, 2010, pp. 1-12).*

* cited by examiner

*Primary Examiner* — Omar Fernandez Rivas
*Assistant Examiner* — Iftekhar Khan
(74) *Attorney, Agent, or Firm* — Fish & Richardson P.C.

(57) ABSTRACT

Methods, systems, and apparatus, including computer programs encoded on a computer storage medium, for identifying paths for moving equipment into buildings at different stages of building construction using a building information model. The system analyzes the building model and building objects completed before a given time and identifies one or more paths that circumnavigate the building objects and can accommodate dimensions of the equipment moving down the path.

33 Claims, 7 Drawing Sheets

BUILDING PATH IDENTIFICATION

BACKGROUND

This specification relates to building information models and computer aided design of buildings, and particularly to identification of paths for moving equipment into buildings at different stages of building construction.

Building information management software is often used to prepare a model of a structure, such as a building, while in the design stages and later during construction. The model can include representations of physical elements, such as columns, beams, walls, slabs, and the like that will be included in the structure, and drawings prepared based on such a model can be used in the actual physical construction of the structure. The model may be prepared and edited by various individuals, including architects and structural engineers, for example.

SUMMARY

In general, one aspect of the subject matter described in this specification can be embodied in methods that include the actions of obtaining a model of a building representing the building at a point in time in construction of the building; obtaining an equipment model representing physical objects to be brought into the building at a starting location in the model to be located at an equipment location in the model; identifying paths that circumnavigate building objects in the model for transporting the equipment from the starting location to a respective destination location in the model, where each path can accommodate dimensions of the equipment; and generating a presentation of the identified paths in a representation of the model. Other implementations of this aspect include corresponding systems, apparatus, and computer programs.

These and other aspects can optionally include one or more of the following features. The respective destination location of at least one of the paths can be the equipment location. The respective destination location of at least one of the paths is not the equipment location. At least one of the building objects is a slab, a wall, a curtain wall, or a support column. Identifying the one or more paths in the model can further comprise ranking the paths based on respective lengths of the paths. Identifying the one or more paths in the model can further comprise identifying one or more outer edges of slabs in the building objects belonging to a given floor in the building and identifying any edges of openings in the slabs; identifying one or more obstructions for the floor; and generating a Voronoi decomposition of the floor based on the identified outer edges of the slabs, the identified edges of openings in the slabs, and the obstructions. Identifying the obstructions for the given floor can further comprise identifying as the one or more obstructions one or more of the building objects for the given floor located at least partially above an elevation of the floor and having bottom surface below the elevation of the floor plus an equipment height.

These and other aspects can optionally include one or more of the following additional features. Identifying the one or more paths in the model can further comprise generating a path diagram comprising a plurality of segments based on the Voronoi decomposition; eliminating from the path diagram any segments that intersect at least one of the identified outer edges of the slabs, the edges of the openings in the slabs or the obstructions; and adding to the path diagram a starting segment, a destination segment and one or more segments based on locations of door building objects on the given floor. One or more candidate paths can be identified, each candidate path comprising one or more of the segments in the path diagram. A number of clearance failures in one or more of the candidate paths can be determined wherein a clearance failure is a point in the path that is impassible for the dimensions of the envelope. One or more of the candidate paths having a respective number of clearance failures that do not exceed a clearance failure threshold can be identified as paths that circumnavigate the one or more building objects. Generating the presentation of the identified paths can further comprise ranking the identified paths based on the respective numbers of clearance failures. One or more of the candidate paths can be smoothed.

Particular implementations of the subject matter described in this specification can be implemented to realize one or more of the following advantages. When large equipment is needed at a particular location in a building under constructions at a certain point in time, the system of the present invention allows users to identify an optimal path (the shortest and passable by the large equipment) and an optimal time for bringing the large equipment into the building. It also allows the user to revise the building information model to optimize the process of bringing in the equipment and to identify the best time for bringing the equipment in.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A three-dimensional building information model (or "model") is a digital representation of physical and functional characteristics of a building or other structure and can be created using building information modeling software. The model includes a representation of a building design as a combination of building objects (or "objects"). An object is an element of the building such as, for example, a slab, a wall, a column, a door, or a void-space, (e.g., a shape of a room). Each object is associated with information regarding physical dimensions of the associated physical object, its location in the model of the building and relationship with other objects. Usually the model also includes a construction schedule that indicates points in time in the construction of building when particular objects will be physically present in the building. The construction schedule can include a time sequence in which to construct physical objects corresponding to the objects in the model during the construction of the building. For example, the objects associated with a foundation of the building will be constructed before the objects associated with higher levels of the building. A version of the model can be generated (e.g., using Revit Architecture software available from Autodesk, Inc. of San Rafael, Calif.) such that it contains only those objects that are scheduled to have been constructed or added to the building at a given point in time.

Figure 1:
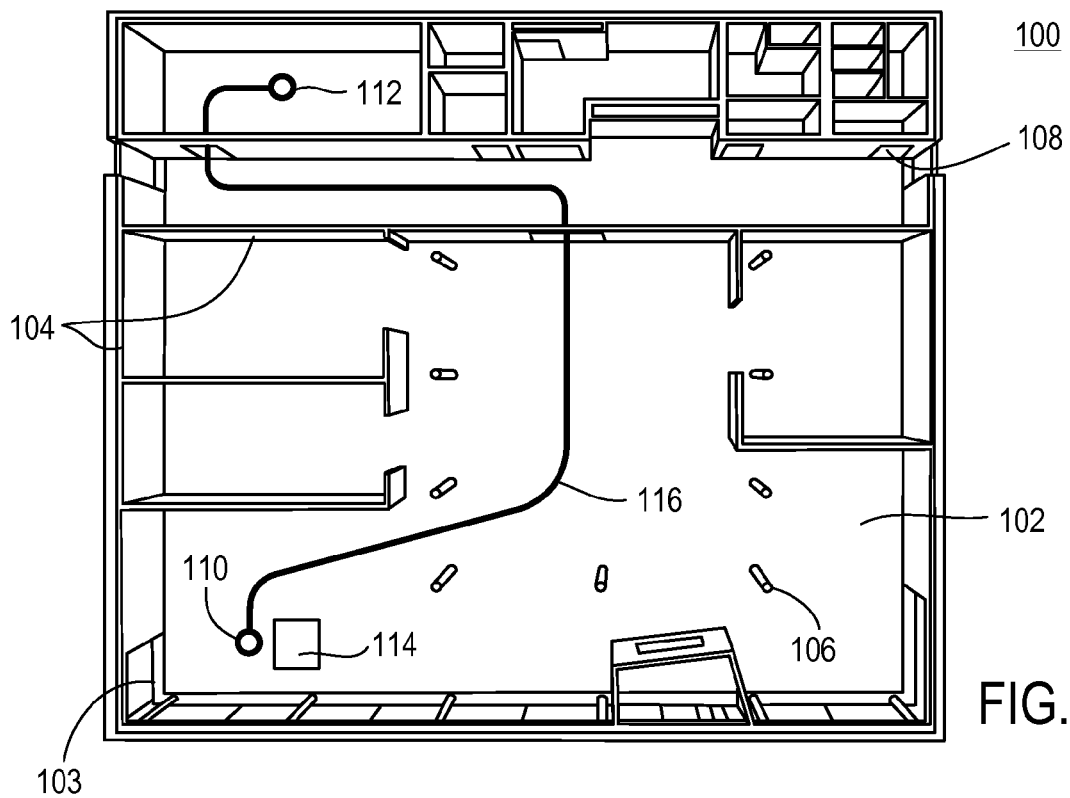
FIG. 1 is an illustration of an example view of a floor in a building information model at a particular point in time during building's construction.

FIG. 1 illustrates an example view of a floor plan 100 of a given floor in a three-dimensional model of the building at the given point in time in its construction. A floor plan is a diagram showing an overhead view of rooms, spaces and other objects located on a given floor of a building. The floor plan 100 is generated by the building information modeling software based on the model of the building. The floor plan 100 shows the building objects completed at the given point in time and related to the given floor, such as the slabs 102 with their edges 103, the walls 104, the columns 106, the doors 108, and other objects. The floor plan 100 also shows a starting location 110 for equipment 114 to be brought onto the given floor and a destination location 112 for the equipment 114 on the floor.

The process of the present invention identifies one or more paths (e.g., 116) leading from the starting location 110 to the destination location 112 and circumnavigating the objects on the floor plan 100 such that they can accommodate dimensions of the equipment 114.

Figure 2:
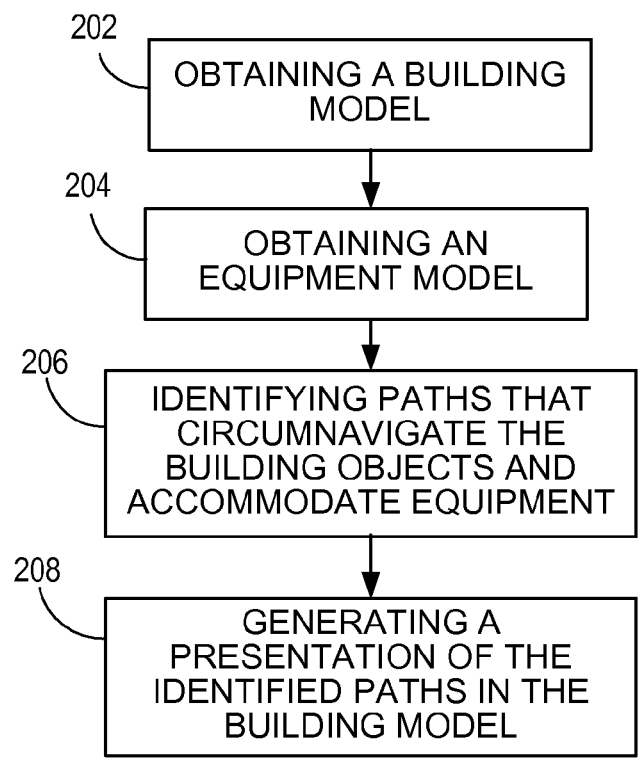
FIG. 2 is an example process for identifying one or more paths in the model of a building.

FIG. 2 illustrates an example process for identifying such paths in a model of a building. The various steps of the process can be implemented in computer software and performed, for example, by one or more data processing apparatus (e.g., servers, personal computers, tablet computers, and so on).

In step 202, the model is obtained. The model contains information regarding the objects located on the floor 100 and having been constructed at the given point in time, such as their nature (e.g., a wall, a window, a slab), their locations, their relationships to each other, time of construction, and time of disassembling.

In step 204, the equipment model is obtained. An equipment model is a digital representation of the equipment to be brought into the building. The equipment model contains at least information about dimensions of the equipment. Sometimes the equipment model also includes information regarding weight, preferred spatial orientation, fragility or material of the equipment.

In step 206, the paths that circumnavigate the building objects and accommodate safe passage of the equipment through the building are identified. The identified paths connect the starting location 110 with the destination location 112. An example technique for identifying the paths is discussed below with regard to FIGS. 3-10.

In step 208, presentations of the identified paths are generated. In some implementations the presentations show a view of the three-dimensional model of the building including the identified paths as they appear in the building. The paths are usually highlighted. If there are any points in the paths needing additional consideration by the user (e.g., clearance failures), these points are usually also highlighted in the presentations. In further implementations, the presentations include a video showing the view of the model and the equipment model moving through the model from the starting location 110 to the destination location 112 following the identified path.

In order to identify the path that circumnavigates the building objects and accommodates the equipment parameters (206), the system analyzes the objects on the given floor and detects outer edges of the slabs of the floor, edges of openings in the slabs of the floor and objects on the floor that are obstructions. An obstruction is a building object, such as a wall or a column, which can cause a clearance failure for equipment traveling down a path. A clearance failure is a location on a path where a virtual box, representing equipment, and moving down the path collides with at least one building object.

Figure 3:
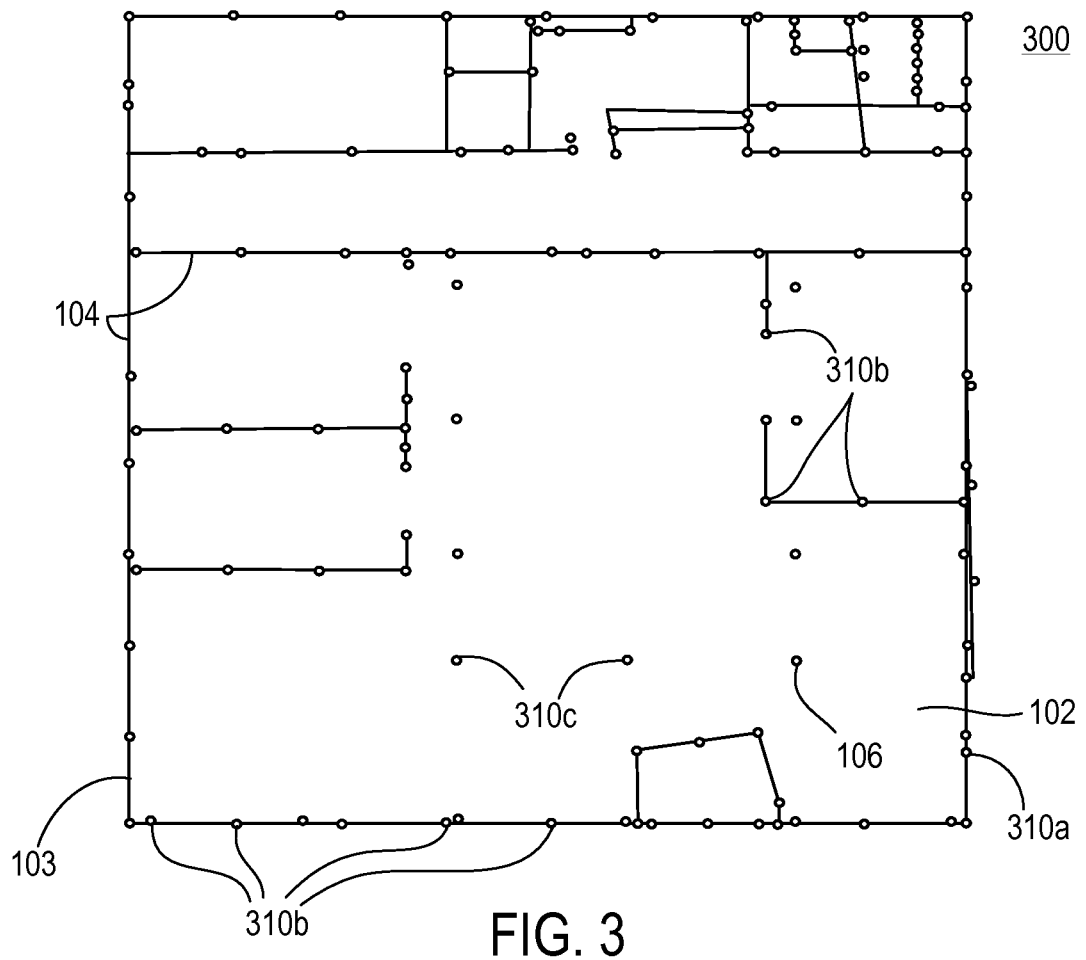
FIG. 3 is an illustration of an example floor plan based on a building information model at a particular point in time during building's construction.

FIG. 3 shows a floor plan 300 of the given floor of the building showing edges (e.g., 103) of the slabs (e.g., 102), and obstructions located on this floor, including walls (e.g., 104), and columns (e.g., 106).

Not all edges of the slabs need to be taken into consideration when the path is identified. To identify the edges of the slabs that should be considered when identifying the path, the system analyzes all slabs and their edges on the given floor. An edge of a slab should not be considered if it is a shared edge. A shared edge is an outer edge of a slab shared by two slabs where top surfaces of the slabs have the same elevation, and a gap between the slabs is less than a gap threshold. Also, an edge of a hole in a slab should not be considered if the maximum width of the hole is less than a whole threshold.

Figure 4:
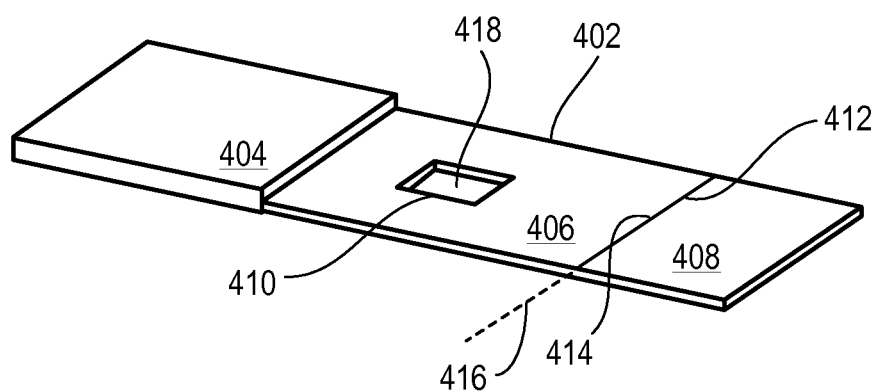
FIG. 4 is an illustration of an example view of slabs of a floor in the model.

FIG. 4 illustrates a process of analyzing the slabs to identify shared edges. This figure shows three slabs 404, 406, 408. All edges of the slabs 404, 406, 408 are analyzed to identify shared edges. The edges to be analyzed include outer edges (e.g., 402) of the slabs 404, 406, 408 and edges (e.g., 410) of the holes (e.g., 418) in the slabs 404, 406, 408.

For instance, when the left edge 412 of the right slab 408 is analyzed, the system deduces from the information contained in the model that this edge 412 is in the same location as the right edge 414 of the center slab 406. From the information contained in the model the system also determines that these two slabs, 406 and 408, have the same top surface elevation, and that a gap 416 between these slabs 406, 408 is less than the gap threshold. Therefore the edges 412 and 414 are shared edges and should not be considered when the path is identified.

In another example, when the edge 410 of the hole 418 in the second slab 406 is analyzed, the system determines whether the maximum width of the hole 418 is below the hole threshold. If the maximum width of the hole 418 is below the hole threshold, the edge 410 of this hole 418 should not be considered when identifying the path.

In some implementations the thresholds used by the system (e.g., the gap threshold, the hole threshold) are adjustable by the user. In other implementations the thresholds are set in the system. Often these thresholds are determined by the occupational safety and health (OSH) standards applicable in the geographic area where the building is located, such as OSHA in the United States, EU OSH in the European countries, HASWA in the United Kingdom, and ILO-OSH 2001 or OHSAS 18000 elsewhere.

To locate the obstructions on the given floor, the system analyzes the building objects on this floor to identify objects that can hinder movements of the equipment 114 through the floor, such as walls, columns, or partitions. A building object is considered an obstruction on a given floor when at least a portion of the object is located above an elevation of the given floor plus a doorstep threshold and the bottom surface of the object is located no higher than the elevation of the floor plus an equipment height threshold. In general, an elevation of a given floor is an elevation of a top surface of a slab forming the floor.

To identify these obstructions the system first detects the elevation of the given floor based on the information in the model. When the elevation of the given floor is determined, the system analyzes the objects belonging to the floor to identify the object that rise above the elevation of the given floor plus the doorstep threshold and have their bottom surface below the elevation of the given floor and the equipment height threshold. This analysis eliminates from consideration the objects that do not rise high above the surface of the given floor to hinder the movement of the equipment 114 and the objects that are located high enough from the floor to allow the equipment 114 to safely pass underneath.

In some implementations only walls, columns and partitions are considered in obstruction analysis. Other types of objects are presumed not to be an obstruction.

Returning to FIG. 3 the floor plan 300 shows footprints of the identified slab edges (e.g., 103) and obstructions, such as walls (e.g., 104) and columns (e.g., 106), on the given floor. Usually a footprint of a wall is a thin rectangle, and a footprint of a column is a shape of the column's cross-section. In some implementations the footprint of the wall is a single line located at the centerline of the wall, and the footprint of the column is a single point located at the center of the column.

After the slab edges and the obstructions (e.g., 103, 104, 106) on the given floor are identified, the system analyzes the floor plan 300 to find paths between the starting location 110 and the destination location 112 which can accommodate movement of the equipment 114 along the path. In some implementations, a Voronoi decomposition is used to identify the paths.

A Voronoi decomposition is a decomposition of a given space, determined by distances to a specified family of objects (subsets) in the space. These objects are usually called the sites. Each such site is associated with a corresponding Voronoi cell, which is a set of all points in the given space whose distance to the given site is not greater than their distance to the other sites.

To identify the sites 310 for the Voronoi decomposition, the system uses the identified edges of the slabs, edges of the holes in the slabs and obstructions on the floor plan 300. Some of the sites (e.g., 310a) are formed based on the edges of the slabs (e.g., 103) that it was determined need to be considered. These sites are spread along the lines identifying footprints of the slab edges at a distance from each other. In some implementations these sites 310a are spread evenly along the edges of the slabs (e.g., 103).

Some of the sites (e.g., 310b) are identified based on the obstructions, such as walls (e.g., 104). The sites based on the walls are positioned on the lines identifying footprints of the walls at a distance from each other. Usually there is a site positioned at each end of the wall and at corners formed by the walls. When the sites (e.g., 310c) are identified based on columns (e.g., 106), they and are positioned at the point identifying a footprint of the column.

Figure 5:
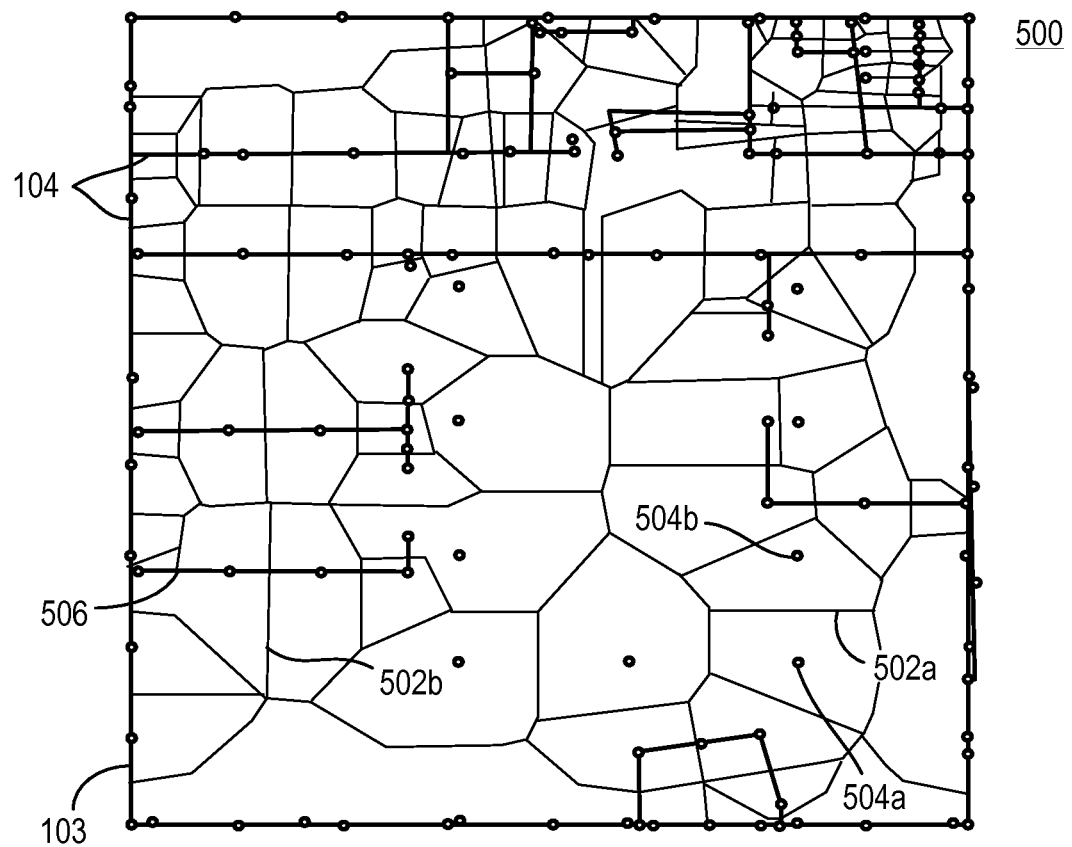
FIG. 5 is an illustration of the example floor plan showing Voronoi decomposition and path diagram.

When all of the Voronoi sites 310 are identified, the system creates a Voronoi decomposition based on these sites and a path diagram 500 corresponding to the decomposition. FIG. 5 shows the floor plan 300 with the path diagram 500 created based on the analysis of this floor plan. The path diagram 500 consists of segments 502 dividing the space of the floor plan 300 into Voronoi subsets. Each segment of the path diagram 500 is positioned an equal distance from two Voronoi sites closest to the segment. For instance, the segment 502a is positioned an equal distance between the Voronoi sites 504a and 504b.

Figure 6:
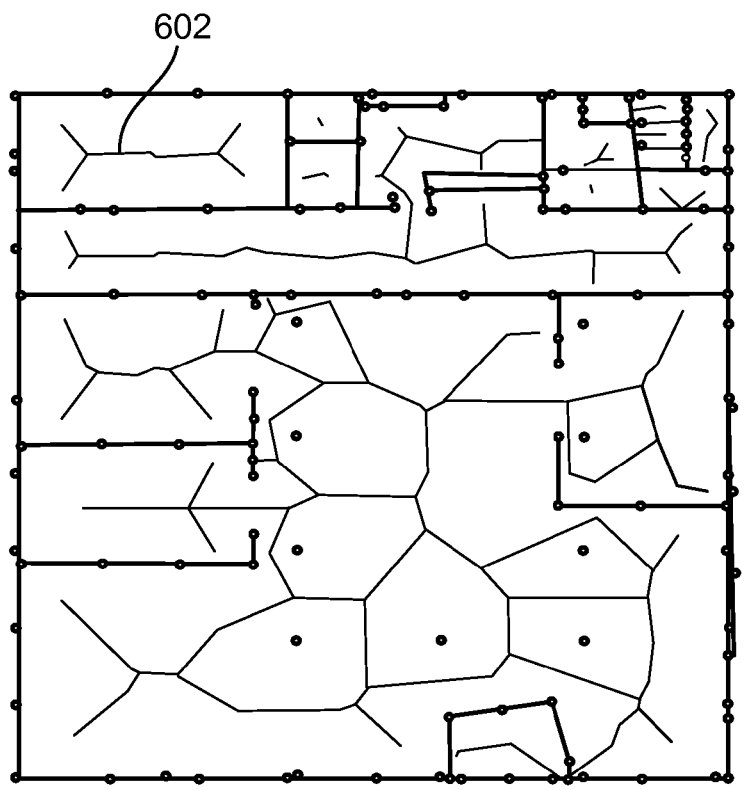
FIG. 6 is an illustration of the example floor plan showing Voronoi decomposition and path diagram.

After the path diagram 500 has been created, the system reviews each segment 502 of the diagram 500 and eliminates impassable segments. A segment is impassable if it crosses a slab edge (e.g., 103), a slab hole (e.g., 418), or an obstruction, such as a walls (e.g., 104). For example, the segment (e.g., 502b) crosses the wall (e.g., 506) and therefore is eliminated from the path diagram 500. FIG. 6 shows the path diagram 500 with the impassable segments eliminated.

After the impassable segments have been eliminated, the path diagram 500 usually splits into portions isolated from each other, such as the portion containing segments 602. This portion of the diagram 500 does not connect with the rest of the diagram 500. In order to connect the isolated portions of the diagram, the system adds to the diagram 500 door segments 702, shown on FIG. 7.

Figure 7:
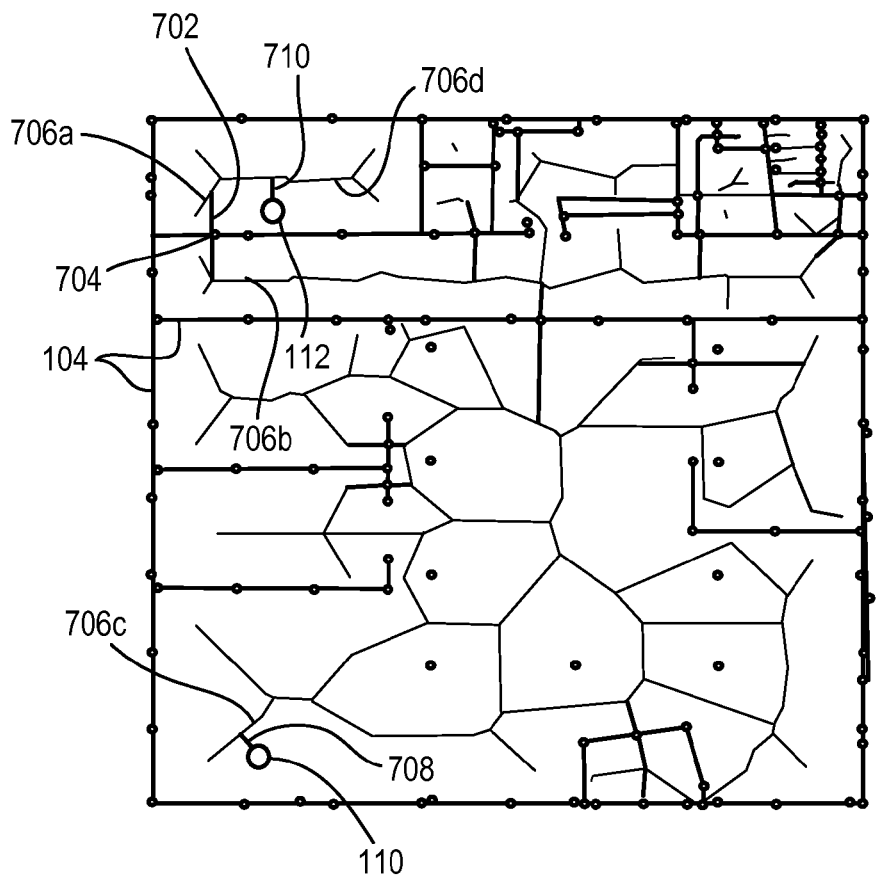
FIG. 7 is an illustration of the example floor plan showing Voronoi decomposition, path diagram, door segments, starting segment and destination segment.

A door segment is a segment based on locations of door building objects. The door segment is connecting two segments on the opposite sides of a wall through a point in the wall corresponding to a center of the door or other suitable opening in the wall. FIG. 7 shows the path diagram 700 with door segments 702 added. To add the door segments to the path diagram 700, the system identifies doors and openings (e.g., 704) in the walls (e.g., 104). For each identified door (e.g., 704) the system adds the door segment (e.g., 702) to the path diagram 700. In some implementations the added door segment (e.g., 702) is perpendicular to the wall (e.g., 104) where the door 704 is located and extends away from the wall 104 until it crosses with one of the existing segments (e.g., 706a-b).

Since the system is identifying a path connecting the starting location 110 and the destination location 112 and consisting of the segments of the path diagram, these locations 110, 112 also need to be connected to the path diagram 700. In order to connect the starting location 110 to the diagram 700 the system adds a starting segment 708 to the diagram 700. A starting segment is a segment extending from a starting point 110 to a segment of the diagram closest to the starting point. For example, the system creates the starting segment 708 extending from the starting point 110 to the segment 706c closest to the starting point 110.

For the destination point 112 the system adds to the diagram 700 a destination segment 710. A destination segment is a segment extending from a destination location to a segment of a diagram closest to the destination point. For example, the system creates the destination segment 710 extending from the destination point 112 to the segment 706d closest to the destination location 112.

After the door segments 702, the starting segment 708 and the destination segment 710 have been added to the path diagram 700, the system identifies candidate paths between the starting location 110 and the destination location 112 consisting of the segments of the diagram 700. A candidate path is a path that connects a starting location and a destination location, consists of one or more segments of a path diagram and may not necessarily accommodate movement of equipment along the path. A variety of path-finding algorithms can be used to identify the shortest path, such as a Dijkstra's algorithm, A* search algorithm, Floyd-Warshall algorithm, and others.

Figure 8:
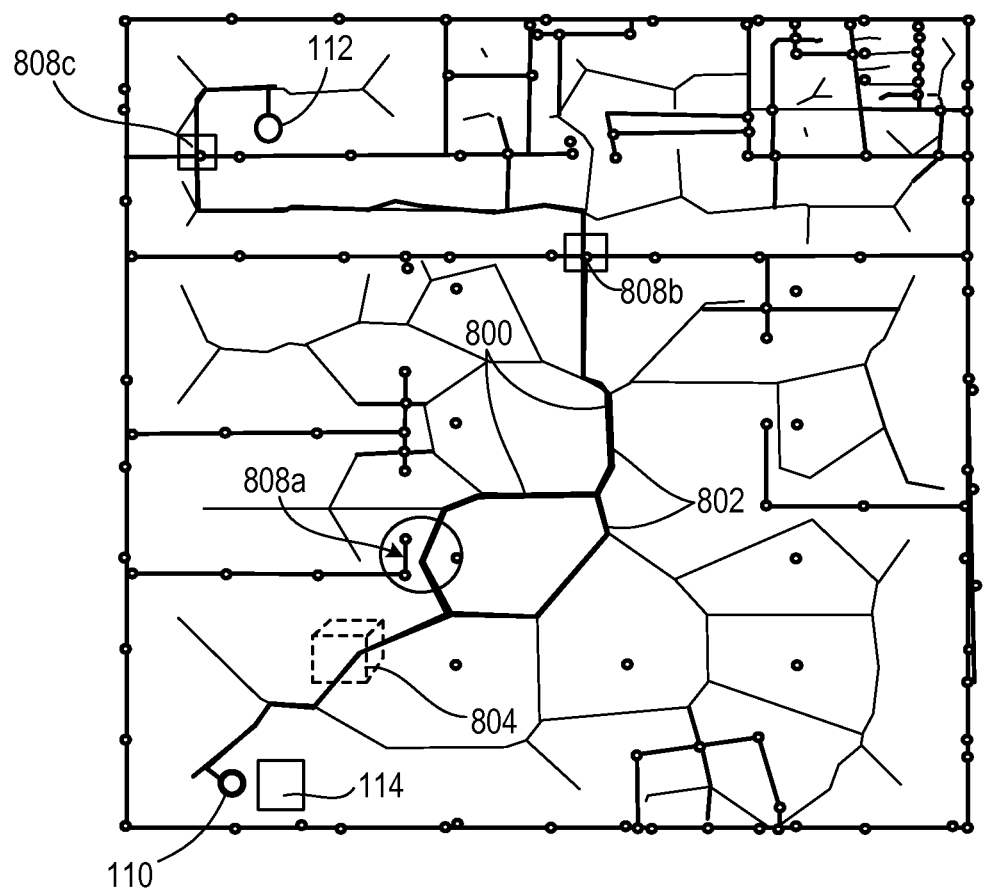
FIG. 8 is an illustration of the example floor plan showing candidate paths.

In some implementations a plurality of candidate paths connecting the starting location 110 and the destination location 112 is identified. Usually these paths are ranked by their length and the paths are considered by the system in order starting with the shortest path. FIG. 8 shows two candidate paths 800 and 802 found by the system connecting the starting location 110 and the destination location 112. After the shortest candidate path 800 is identified, the system checks whether this path 800 is feasible. A path is feasible when a number of clearance failures along this path is less than a clearance failure threshold N. The clearance failure threshold N can be adjusted by the user or pre-set in the system. A virtual box is created by the system based on the equipment model and has at least the same height, width and length as the equipment 114.

The system creates the virtual box 804 and simulates movement of the virtual box 804 along the shortest candidate path 800. When the virtual box 804 collides with one of the edges of the slabs, edges of the holes in the slabs or obstructions, the system identifies that collision as a clearance failure 808. The system records the number of clearance failures (e.g., 808*a-c*) as the virtual box 802 moves along the path 800. When the number of clearance failures reaches N the system stops examining the path and marks it as not feasible.

After the current path is marked as not feasible, the system identifies the next longer candidate path (e.g., 802) and evaluates it for clearance failures as described above. If this path also has N or more clearance failures, the system continues searching for a feasible path until it finds one or exhausts all available paths.

If the system is not able to identify a feasible path, in some implementations one or more paths with least number of clearance failures or one or more paths with shortest lengths, or both, are presented to the user. In other implementations, if the system is not able to identify a feasible path, the user is given an opportunity to revise the clearance failure threshold.

Figure 9:
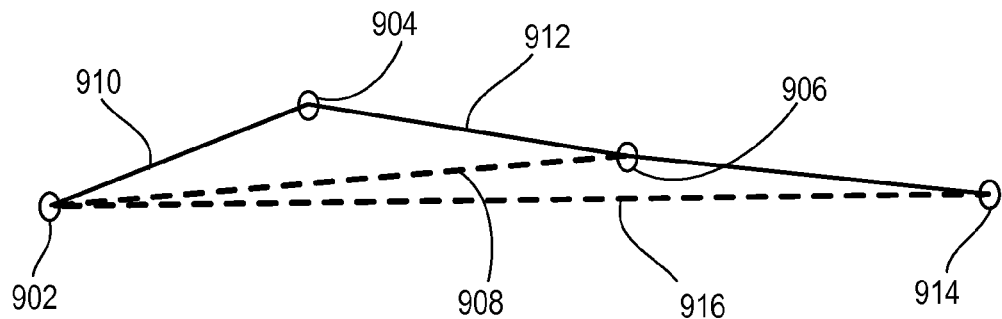
FIG. 9 is an illustration of an example path smoothing process.

In some implementations, the identified feasible path (e.g., 802) is smoothed before it is presented to the user. FIG. 9 illustrates the smoothing process for a portion of a feasible path 900. The smoothing process starts with identifying three sequential nodes of the path 900. A node is a location on a path where two neighboring segments of the path meet.

After the three sequential nodes (the first node 902, the second node 904 and the third node 906) are identified, the system creates a new segment 908, connecting the first node 902 and the third node 906 directly. The system examines this new segment 908 for feasibility. If the new segment 908 does not create clearance failures or the total number of clearance failures of the path 900 with the new clearance failures of the new segment 908 is below N, the system marks this new segment 908 as feasible and replaces the two segments 910, 912 and the node 904 with this segment 908. After the new segment 908 is marked as feasible, the system repeats the process with three new consecutive nodes 902, 906 and 914, starting with the first node of the new segment 908. Another new segment 916 connecting the first node 902 and the fourth node 914 is created and checked for feasibility.

Figure 10:
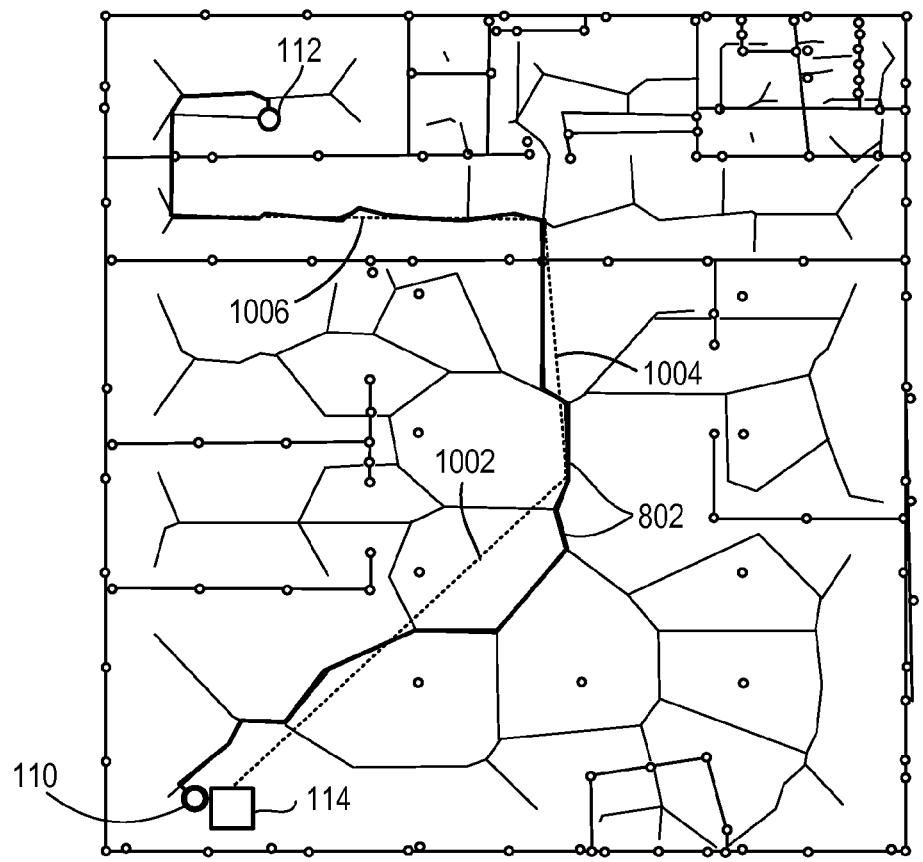
FIG. 10 is an illustration of the example floor plan showing a smoothed path.

If a new segment (e.g., 908) is not feasible, i.e. it creates one or more clearance failures and the number of clearance failures of the path 900 with the clearance failures added by the new segment is N or more, the system moves on to the next node (e.g., 904) along the path 900, creates the next new segment (not shown) between the next node and the node second from the next node (e.g., 914), and checks that next new segment for feasibility. The smoothing process is complete when the system reaches the end of the path, either the starting location or the destination location. FIG. 10 shows a smoothed path 1002 with new smoothed segments 1002, 1004, 1006 replacing portions of the old path 802.

After the system identifies the first feasible path, in some implementations the system presents this identified feasible path to the user. In other implementations the system continues to analyze the paths to find a path without clearance failures. In yet other implementations, after the first feasible path is identified, the system identifies another predetermined number of feasible paths and presents them to the user. When a path with clearance failures is presented to the user, the clearance failures are highlighted.

Figure 11:
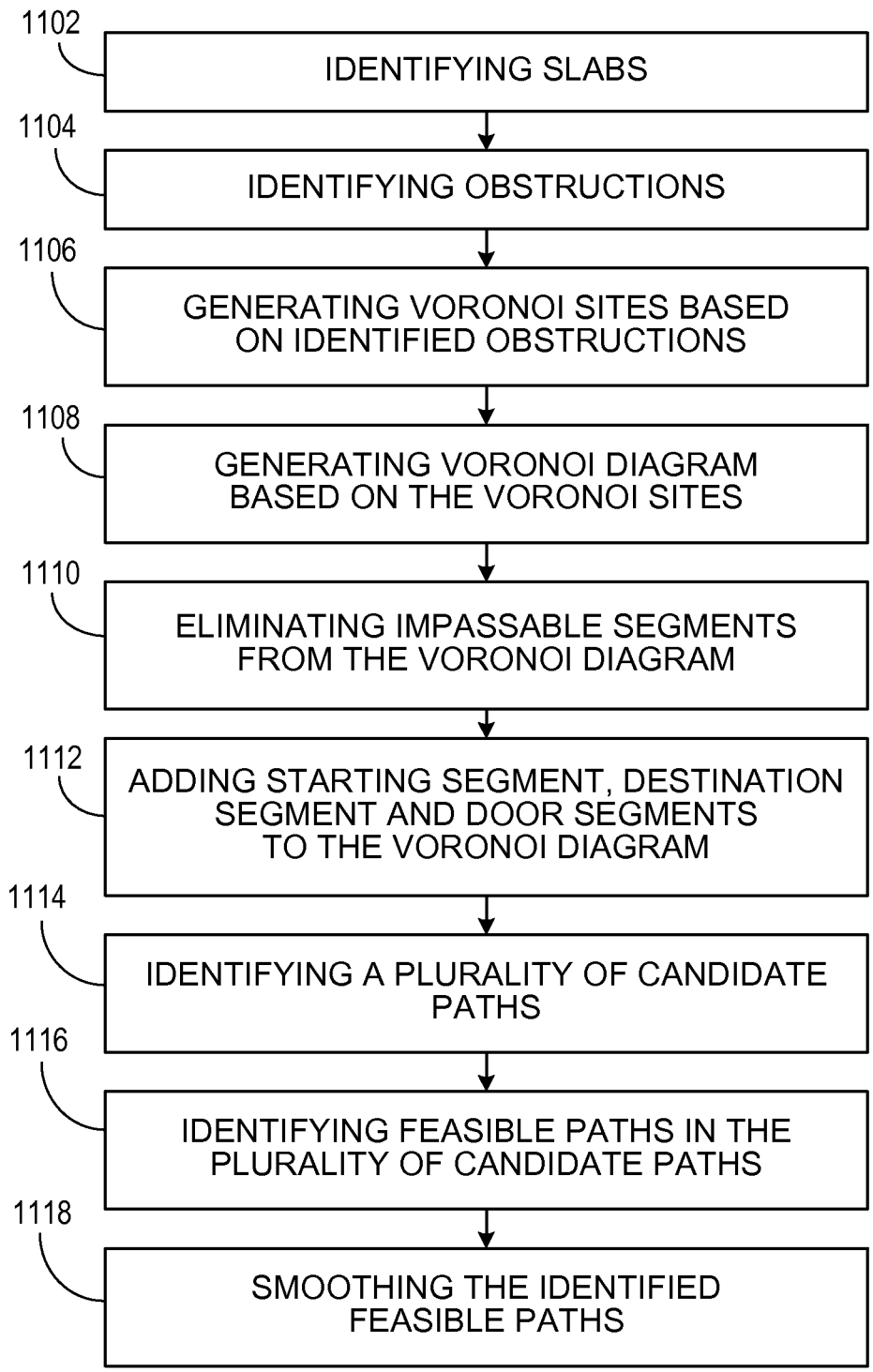
FIG. 11 is an example process for identifying paths that circumnavigate the building objects and accommodate equipment.

FIG. 11 illustrates an example process for identifying one or more paths that circumnavigate the building objects and accommodate the equipment 114 in the model of the building. The various steps of the process can be implemented in computer software and performed, for example, by one or more data processing apparatus (e.g., servers, personal computers, tablet computers, and so on).

In step 1102, the slabs and the openings in the slabs of the given floor are identified based on the model of the building. Next, in step 1104, the obstructions are identified on the floor based on the building objects of the floor. After the obstructions are identified, the Voronoi decomposition is generated based on the edges of the identified slabs, the edges of the identified holes in the slabs, and the identified obstructions (1106) and the path diagram is created based on the Voronoi decomposition (1108). The path diagram is modified by eliminating impassable segments (1110) and adding the starting segment, the destination segment, and the door segments (1112). A plurality of candidate paths are identified in the path diagram (1114) and then the number of clearance failures for the identified candidate paths is determined (1116) and feasible paths are identified (1118). In some implementations the feasible paths are also smoothed (1120) before they are represented to the user.

In some implementations the starting location (e.g. 110) and the destination location (e.g. 112) are positioned on different floors of the building. In this case the system identifies, among the building objects, access structures connecting the floor where the starting location is, the floor where the destination location is, and every floor in between. An access structure is a building structure that facilitates movement of equipment from one floor of a building to another, such as a ramp, stairs, an elevator, etc. The system analyzes the access structures to identify which ones are suitable to be included in the path of the equipment 114. To be suitable an access structures should be, for example, not too narrow, not too steep, and able to carry a weight of the equipment. Unsuitable access structures are eliminated from consideration by the system.

The system also creates Voronoi diagrams for each of these floors. Locations of the suitable access structures on a given floor, connecting the given floor to the other floors in question, are identified, and marked as an access node of the Voronoi diagram of this given floor. An access node is a node of a Voronoi diagram, positioned at the location of an access structure. The access nodes are then connected to the rest of the Voronoi diagram of the given floor by an access segment. An access segment is a segment of a Voronoi diagram connecting an access location to the closest segment of the Voronoi diagram. The access nodes of different floors belonging to the same access structure are identified as segments of the Voronoi diagram and connect the Voronoi diagram of the given floor to Voronoi diagrams of other floors in the building. The resulting multi-layer Voronoi diagram is analyzed similarly to the one-level Voronoi diagram discussed above.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method implemented by data processing apparatus, the method comprising:
    obtaining a model of a building under construction wherein the model represents the building and includes an associated construction schedule, and wherein the model contains a plurality of building objects that are indicated as being present at different points in time by construction schedule;
    determining a best time to transport one or more physical objects based on one or more identified paths, including for a plurality of different times;
    generating a representation of the model a given time including locating the plurality of building objects at respective locations in the building in accordance with the construction schedule and the given time;
    obtaining an equipment model representing the one or more physical objects to be brought into the model at some point in time in the construction of the building at a starting location in the model to be located at an equipment location in the model;
    identifying one or more paths that circumnavigate one or more of the building objects in the representation of the model based on their location at the given time in the construction schedule for transporting the physical objects represented by the equipment model from the starting location in the representation of the model to a respective destination location in the representation of the model at the given time, wherein each path can accommodate dimensions of an envelope encompassing the one or more physical objects in the equipment model within a predetermined number of clearance failures, wherein identifying one or more paths further includes generating a path diagram, reviewing each segment in the path diagram to remove impassable segments, identifying isolated portions of the path diagram based on removal of impassable segments, and connecting isolated portions of the path diagram by adding door segments, wherein adding door segments further includes identifying doors and openings in a corresponding wall, add a door segment to the path diagram perpendicular to the corresponding wall and extending away from the wall until the door segment crosses with an existing segment in the path diagram;
    and
    generating a presentation of one or more of the identified paths in a representation of the model including determining a best time to transport the physical objects based on the one or more identified paths for the plurality of different times.

2. The method of claim 1 wherein the respective destination location of at least one of the paths is the equipment location.

3. The method of claim 1 wherein the respective destination location of at least one of the paths is not the equipment location.

4. The method of claim 1 wherein at least one of the building objects is a slab, a wall, a curtain wall, or a support column.

5. The method of claim 1 wherein identifying the one or more paths in the representation of the model further comprises:
    ranking the paths based on respective lengths of the paths.

6. The method of claim 1 wherein identifying the one or more paths in the representation of the model further comprises:
    identifying one or more outer edges of slabs in the building objects belonging to a given floor in the building and identifying any edges of openings in the slabs;
    identifying one or more obstructions for the floor; and
    generating a Voronoi decomposition of the floor based on the identified outer edges of the slabs, the identified edges of openings in the slabs, and the obstructions.

7. The method of claim 6 wherein identifying the obstructions for the given floor further comprises identifying as the one or more obstructions one or more of the building objects for the given floor located at least partially above an elevation of the floor and having bottom surface below the elevation of the floor plus an equipment height.

8. The method of claim 6 wherein identifying the one or more paths in the representation of the model further comprises:
generating a path diagram comprising a plurality of segments based on the Voronoi decomposition;
eliminating from the path diagram any segments that intersect at least one of the identified outer edges of the slabs, the edges of the openings in the slabs or the obstructions; and
adding to the path diagram a starting segment, a destination segment and one or more segments based on locations of door building objects on the given floor.

9. The method of claim 8, further comprising:
identifying one or more candidate paths each candidate path comprising one or more of the segments in the path diagram;
determining a number of clearance failures in one or more of the candidate paths wherein a clearance failure is a point in the path that is impassible for the dimensions of the envelope; and
identifying one or more of the candidate paths having a respective number of clearance failures that do not exceed a clearance failure threshold as paths that circumnavigate the one or more building objects wherein the threshold is non-zero.

10. The method of claim 9 wherein generating the presentation of the identified paths further comprises ranking the identified paths based on the respective numbers of clearance failures.

11. The method of claim 9, further comprising smoothing one or more of the candidate paths.

12. A machine-readable storage device having instructions stored thereon; and
data processing apparatus operable to execute the instructions to perform operations comprising:
obtaining a model of a building under construction wherein the model represents the building and includes an associated construction schedule, and wherein the model contains a plurality of building objects that are indicated as being present at different points in time by construction schedule;
determining a best time to transport one or more physical objects based on one or more identified paths, including for a plurality of different times;
generating a representation of the model a given time including locating the plurality of building objects at respective locations in the building in accordance with the construction schedule and the given time;
obtaining an equipment model representing the one or more physical objects to be brought into the model at some point in time in the construction of the building at a starting location in the model to be located at an equipment location in the model;
identifying one or more paths that circumnavigate one or more of the building objects in the representation of the model based on their location at the given time in the construction schedule for transporting the physical objects represented by the equipment model from the starting location in the representation of the model to a respective destination location in the representation of the model at the given time, wherein each path can accommodate dimensions of an envelope encompassing the one or more physical objects in the equipment model within a predetermined number of clearance failures, wherein identifying one or more paths further includes generating a path diagram, reviewing each segment in the path diagram to remove impassable segments, identifying isolated portions of the path diagram based on removal of impassable segments, and connecting isolated portions of the path diagram by adding door segments, wherein adding door segments further includes identifying doors and openings in a corresponding wall, add a door segment to the path diagram perpendicular to the corresponding wall and extending away from the wall until the door segment crosses with an existing segment in the path diagram; and
generating a presentation of one or more of the identified paths in a representation of the model including determining a best time to transport the physical objects based on the one or more identified paths for the plurality of different times.

13. The system of claim 12 wherein the respective destination location of at least one of the paths is the equipment location.

14. The system of claim 12 wherein the respective destination location of at least one of the paths is not the equipment location.

15. The system of claim 12 wherein at least one of the building objects is a slab, a wall, a curtain wall, or a support column.

16. The system of claim 12 wherein identifying the one or more paths in the representation of the model further comprises:
ranking the paths based on respective lengths of the paths.

17. The system of claim 12 wherein identifying the one or more paths in the representation of the model further comprises:
identifying one or more outer edges of slabs in the building objects belonging to a given floor in the building and identifying any edges of openings in the slabs;
identifying one or more obstructions for the floor; and
generating a Voronoi decomposition of the floor based on the identified outer edges of the slabs, the identified edges of openings in the slabs, and the obstructions.

18. The system of claim 17 wherein identifying the obstructions for the given floor further comprises identifying as the one or more obstructions one or more of the building objects for the given floor located at least partially above an elevation of the floor and having bottom surface below the elevation of the floor plus an equipment height.

19. The system of claim 17 wherein identifying the one or more paths in the representation of the model further comprises:
generating a path diagram comprising a plurality of segments based on the Voronoi decomposition;
eliminating from the path diagram any segments that intersect at least one of the identified outer edges of the slabs, the edges of the openings in the slabs or the obstructions; and
adding to the path diagram a starting segment, a destination segment and one or more segments based on locations of door building objects on the given floor.

20. The system of claim 19, further comprising:
identifying one or more candidate paths each candidate path comprising one or more of the segments in the path diagram;
determining a number of clearance failures in one or more of the candidate paths wherein a clearance failure is a point in the path that is impassible for the dimensions of the envelope; and identifying one or more of the candidate paths having a respective number of clearance failures that do not exceed a clearance failure threshold as paths that circumnavigate the one or more building objects, wherein the number of clearance failures is non-zero.

21. The system of claim 20 wherein generating the presentation of the identified paths further comprises ranking the identified paths based on the respective numbers of clearance failures.

22. The system of claim 20, further comprising smoothing one or more of the candidate paths.

23. A storage device having instructions stored thereon that, when executed by data processing apparatus, cause the data processing apparatus to perform operations comprising:
   obtaining a model of a building under construction wherein the model represents the building and includes an associated construction schedule, and wherein the model contains a plurality of building objects that are indicated as being present at different points in time by construction schedule;
   determining a best time to transport one or more physical objects based on one or more identified paths, including for a plurality of different times;
   generating a representation of the model a given time including locating the plurality of building objects at respective locations in the building in accordance with the construction schedule and the given time;
   obtaining an equipment model representing the one or more physical objects to be brought into the model at some point in time in the construction of the building at a starting location in the model to be located at an equipment location in the model;
   identifying one or more paths that circumnavigate one or more of the building objects in the representation of the model based on their location at the given time in the construction schedule for transporting the physical objects represented by the equipment model from the starting location in the representation of the model to a respective destination location in the representation of the model at the given time, wherein each path can accommodate dimensions of an envelope encompassing the one or more physical objects in the equipment model within a predetermined number of clearance failures, wherein identifying one or more paths further includes generating a path diagram, reviewing each segment in the path diagram to remove impassable segments, identifying isolated portions of the path diagram based on removal of impassable segments, and connecting isolated portions of the path diagram by adding door segments, wherein adding door segments further includes identifying doors and openings in a corresponding wall, add a door segment to the path diagram perpendicular to the corresponding wall and extending away from the wall until the door segment crosses with an existing segment in the path diagram; and
   generating a presentation of one or more of the identified paths in a representation of the model including determining a best time to transport the physical objects based on the one or more identified paths for the plurality of different times.

24. The storage device of claim 23 wherein the respective destination location of at least one of the paths is the equipment location.

25. The method of claim 23 wherein the respective destination location of at least one of the paths is not the equipment location.

26. The method of claim 23 wherein at least one of the building objects is a slab, a wall, a curtain wall, or a support column.

27. The storage device of claim 23 wherein identifying the one or more paths in the model further comprises:
   ranking the paths based on respective lengths of the paths.

28. The storage device of claim 23 wherein identifying the one or more paths in the model further comprises:
   identifying one or more outer edges of slabs in the building objects belonging to a given floor in the building and identifying any edges of openings in the slabs;
   identifying one or more outer obstructions for the floor; and
   generating a Voronoi decomposition of the floor based on the identified outer edges of the slabs, the identified edges of openings in the slabs, and the obstructions.

29. The storage device of claim 28 wherein identifying the obstructions for the given floor further comprises identifying as the one or more obstructions one or more of the building objects for the given floor located at least partially above an elevation of the floor and having bottom surface below the elevation of the floor plus an equipment height.

30. The storage device of claim 28 wherein identifying the one or more paths in the model further comprises:
   generating a path diagram comprising a plurality of segments based on the Voronoi decomposition;
   eliminating from the path diagram any segments that intersect at least one of the identified outer edges of the slabs, the edges of the openings in the slabs or the obstructions; and
   adding to the path diagram a starting segment, a destination segment and one or more segments based on locations of door building objects on the given floor.

31. The storage device of claim 30, further comprising:
   identifying one or more candidate paths each candidate path comprising one or more of the segments in the path diagram;
   determining a number of clearance failures in one or more of the candidate paths wherein a clearance failure is a point in the path that is impassable for the dimensions of the envelope; and
   identifying one or more of the candidate paths having a respective number of clearance failures that do not exceed a clearance failure threshold as paths that circumnavigate the one or more building objects, wherein the number of clearance failures is non-zero.

32. The storage device of claim 31 wherein generating the presentation of the identified paths further comprises ranking the identified paths based on the respective numbers of clearance failures.

33. The storage device of claim 31, further comprising smoothing one or more of the candidate paths.

* * * * *

UNITED STATES PATENT AND TRADEMARK OFFICE
CERTIFICATE OF CORRECTION

PATENT NO. : 9,292,629 B2  
APPLICATION NO. : 13/560442  
DATED : March 22, 2016  
INVENTOR(S) : Wawan Solihin Page 1 of 1

It is certified that error appears in the above-identified patent and that said Letters Patent is hereby corrected as shown below:

In the Claims

Column 12, line 4, in claim 1: after "model" insert --at--.

Column 13, line 35, in claim 12: after "A" insert --system comprising a--.

Column 13, line 48, in claim 12: after "model" insert --at--.

Column 15, line 24, in claim 23: after "model" insert --at--.

Column 16, line 11, in claim 27: after "in the" insert --representation of the--.

Column 16, line 14, in claim 28: after "in the" insert --representation of the--.

Column 16, line 19, in claim 28: after "more" delete "outer".

Signed and Sealed this  
Seventh Day of June, 2016

Michelle K. Lee  
*Director of the United States Patent and Trademark Office*